(12) United States Patent
Swaminathan et al.

(10) Patent No.: US 9,674,954 B2
(45) Date of Patent: Jun. 6, 2017

(54) CHIP PACKAGE CONNECTOR ASSEMBLY

(71) Applicant: Intel Corporation, Santa Clara, CA (US)

(72) Inventors: Rajasekaran Swaminathan, Tempe, AZ (US); Donald T. Tran, Phoenix, AZ (US); Brent S. Stone, Chandler, AZ (US); Ram Viswanath, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 554 days.

(21) Appl. No.: 13/826,614

(22) Filed: Mar. 14, 2013

(65) Prior Publication Data

US 2014/0268577 A1    Sep. 18, 2014

(51) Int. Cl.
| | |
|---|---|
| *H05K 1/11* | (2006.01) |
| *H05K 1/14* | (2006.01) |
| *H05K 1/18* | (2006.01) |
| *H05K 1/02* | (2006.01) |
| *H01R 12/62* | (2011.01) |

(52) U.S. Cl.
CPC ............ *H05K 1/11* (2013.01); *H05K 1/0204* (2013.01); *H05K 1/0298* (2013.01); *H05K 1/117* (2013.01); *H05K 1/181* (2013.01); *H01R 12/62* (2013.01); *H05K 1/111* (2013.01); *H05K 2201/094* (2013.01); *H05K 2201/10189* (2013.01); *H05K 2201/10356* (2013.01); *H05K 2201/10378* (2013.01); *Y02P 70/611* (2015.11)

(58) Field of Classification Search
CPC ........ H05K 1/111; H05K 1/141; H05K 1/115; H05K 1/181; H05K 1/0237; H05K 1/0243

USPC ............. 361/763–785, 803, 749–750; 174/254–261

See application file for complete search history.

(56) References Cited

U.S. PATENT DOCUMENTS

| | | | | |
|---|---|---|---|---|
| 5,859,538 A | * | 1/1999 | Self ................ | G01R 31/2886 324/754.07 |
| 6,354,844 B1 | * | 3/2002 | Coico ............... | H05K 3/325 439/260 |

(Continued)

FOREIGN PATENT DOCUMENTS

| | | |
|---|---|---|
| CN | 104299951 A | 1/2015 |
| EP | 2306592 A2 | 4/2011 |

(Continued)

OTHER PUBLICATIONS

"European Application Serial No. 14158391.4, Examination Notification Art. 94(3) mailed Apr. 2, 2015", 6 pgs.
"Chinese Application Serial No. 201410213368.6, Office Action mailed Jul. 29, 2016", W/ English Translation, 19 pgs.
(Continued)

*Primary Examiner* — Tuan T Dinh
(74) *Attorney, Agent, or Firm* — Schwegman Lundberg & Woessner, P.A.

(57) ABSTRACT

This disclosure relates generally to a chip package assembly arranged to be electrically coupled to a circuit board including a plurality of circuit board contacts. The chip package assembly may include a chip package including a first side and a second side, the second side including a first plurality of contacts arranged to be electrically coupled to the plurality of circuit board contacts and a second plurality of contacts arranged to be electrically coupled to a remote device via a connector assembly.

17 Claims, 6 Drawing Sheets

(56) References Cited

U.S. PATENT DOCUMENTS

| | | | |
|---|---|---|---|
| 6,392,899 B1* | 5/2002 | Harrison | G06F 1/189 248/610 |
| 6,586,684 B2* | 7/2003 | Frutschy et al. | 174/260 |
| 6,845,013 B2* | 1/2005 | Hartke et al. | 361/704 |
| 7,439,449 B1* | 10/2008 | Kumar | G02B 6/4292 174/254 |
| 7,729,121 B1* | 6/2010 | Deshpande et al. | 361/704 |
| 8,102,657 B2* | 1/2012 | Hiew et al. | 361/737 |
| 8,363,418 B2* | 1/2013 | Johnson et al. | 361/760 |
| 2003/0000739 A1 | 1/2003 | Frutschy et al. | |
| 2006/0001163 A1* | 1/2006 | Kolbehdari | H05K 1/147 257/758 |
| 2007/0149000 A1 | 6/2007 | Baskaran et al. | |
| 2011/0028017 A1 | 2/2011 | Chuo et al. | |
| 2011/0051381 A1* | 3/2011 | Sugiyama | H01R 12/62 361/749 |
| 2012/0052699 A1 | 3/2012 | Macdougall | |

FOREIGN PATENT DOCUMENTS

| | | |
|---|---|---|
| KR | 101594006 B1 | 2/2016 |
| TW | 201104979 A1 | 2/2011 |

OTHER PUBLICATIONS

"Chinese Application Serial No. 201410213368.6, Response filed Dec. 9, 2016 to Office Action mailed Jul. 29, 2016" w/ English Claims, 15 pgs.

"European Application Serial No. 14158391.4, Response filed Aug. 12, 2015 to Examination Notification Art. 94(3) mailed Apr. 2, 2015", 43 pgs.

* cited by examiner

CHIP PACKAGE CONNECTOR ASSEMBLY

TECHNICAL FIELD

The disclosure herein relates generally to a connector assembly for a chip package.

BACKGROUND ART

Electronic chip packages have long utilized a variety of modes for transmitting and receiving information between a die contained within the package and electronic devices outside of the package. Electrical interconnects provide electrical connectivity within the package between the die and the various communication components that can be utilized to transmit and receive electronic signals from and to the die. One such communication component is a conventional socket-connected solder bump, configured to create a physical electrical connection between the package and another electronic device that via a motherboard or other circuit board. Another such communication component is a cable connector that permits communication between the die and an external electronic device without respect to a motherboard.

DESCRIPTION OF THE EMBODIMENTS

Figure 1:
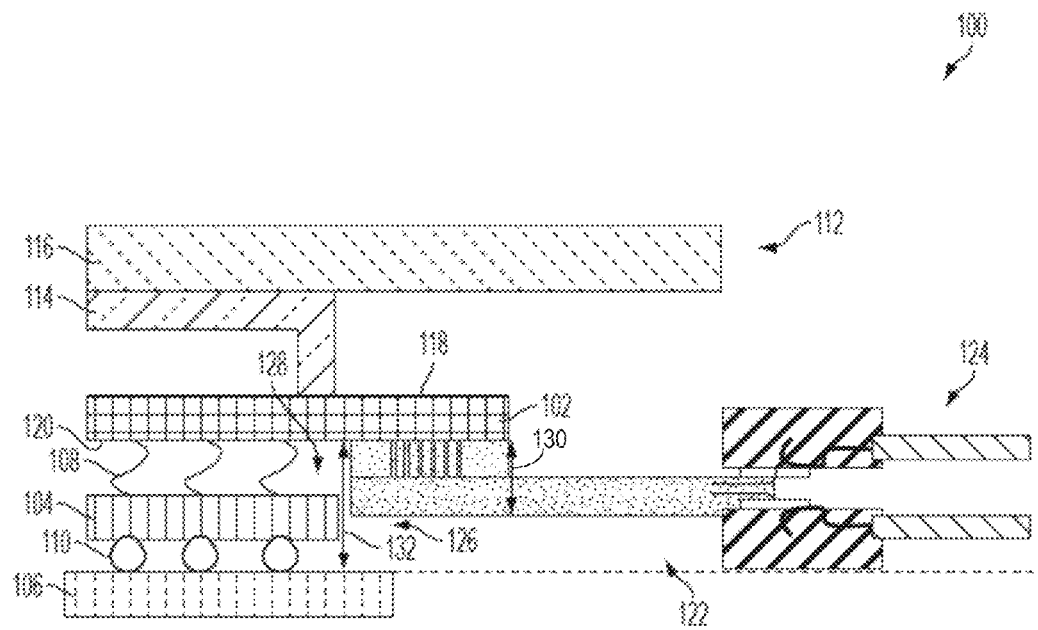
FIG. 1 is a side profile of a chip package assembly.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Conventionally, chip packages may include or be associated with additional componentry, such as a socket to facilitate connection to a circuit board and a heat sink for temperature management. While solder-bump-based communication may be essentially unaffected by such additional componentry, cable-based communication may be obstructed by such additional componentry. Additionally, owing to the presence of the circuit board itself, the use of a cable connection on the bottom side of the chip package, i.e., the side with the solder bump connections, may be impractical or impossible given conventional connectors and connector assemblies between the chip package and the cable. Consequently, chip packages may not incorporate bottom-side cable connections.

Further, communication via a circuit board may provide for relatively small size requirements for the communication interface in comparison with cable connection. Circuit board-based communication may utilize half or less of the space on a chip package to provide the physical interface for the electrical connection than conventional cable communication. However, certain uses of chip packages on circuit boards has resulted in circuit boards becoming relatively crowded, limiting the potential for placing additional electronic communication lines within the circuit board. Additionally, the electronic communication lines in a circuit board may be relatively slow in comparison with certain cable communication lines, such as coaxial cables.

However, while cable communication lines, such as coaxial cables, provide advantages in data rate and avoiding crowding on circuit boards, certain cables, including coaxial cables, are also relatively thick. Factoring in both the communicative element and insulation, a pitch between adjacent cables can be two or more times greater than the minimum pitch of the connectors on the chip package to which the cables may be connected. In other words, while the connectors on the chip package may be designed with fabrication technology that would permit a certain minimum pitch, the characteristics of contemporary cables may result in the connectors on the chip package necessarily being spaced with a pitch larger than the minimum pitch in order to provide enough space to couple with the cables.

A chip package and connector assembly has been developed that allows for bottom-side cable connection on the chip package and the use of both relatively high-gauge cables as well as low-pitch connectors on the chip package. The bottom-side cable connection may be utilized with respect to connector assemblies detailed herein and any additional suitable connector assembly. The connector assembly disclosed herein utilizes a pitch translation that permits a first pitch on the chip package and a second, larger pitch on the cable side. The connector assembly may include a connector that translates from multiple rows to a single row and may provide for ninety (90) degree directional translation.

FIG. 1 is a side profile of a chip package assembly 100. The chip package assembly 100 includes a chip package 102 and a socket 104 mechanically and electrically coupled to a circuit board 106, such as a motherboard. The socket 104 may conventionally mechanically secure the chip package 102. The chip package 102 includes socket contacts 108 such as may interface with a land grid array (LGA) socket 104. The socket 104 has circuit board contacts 110, such as solder balls, that may both mechanically secure the socket 104 with respect to the circuit board 106 and provide an electrical interface between the chip package 102, the circuit board 106, and electronic components coupled to the circuit board 106. The chip package assembly 100 optionally does not include the socket 108, in which case the chip package 102 couples directly to the circuit board 106. The chip package assembly 100 further includes heat management componentry 112, such as an integrated heat spreader 114 and a heat sink 116.

The chip package 102 has a top side 118 and a bottom side 120. The bottom side 120 is defined as the major surface facing the circuit board 106 and that includes the socket contacts 108. The top side 118 is the major surface opposite the bottom side 120. In various examples, integrated circuit components of the chip package 102 may be on or proximate the bottom side 120 in conventional flip chip configurations.

A connector assembly 122 provides an electrical and mechanical interface between the chip package 102 and a cable 124. The cable 124 may provide an electronic communication interface, such as a direct connection, between the chip package 102 and componentry such as a device not directly coupled to the circuit board 104 or to a discrete component on the circuit board 104. The cable 124 may, at least in part, provide communication outside of the scope of the circuit board 104. The cable 124 is made of electrically conductive lines that are configured to provide electrical communication between the chip package 102 and an electrical component. The connector assembly 122 as illustrated is described in detail herein. However, it is to be understood that alternative connector assemblies may also be utilized as are consistent with the disclosure herein.

One example of an alternative connector assembly has first conductive members secured with respect to one another that form a first row. The connector assembly additionally has second conductive members secured with respect to one another, a first subset of the second conductive members forming a second row and a second subset of the second conductive members forming a third row, the second and third rows being parallel and offset with respect to one another and the second and third rows being orthogonal to the first row. Individual ones of the first and second conductive members may arranged to be coupled at a first end to a corresponding one of contacts. Ones of the first conductive members may be arranged to be coupled to a corresponding individual one of the second conductive members proximate a second end of each of the first and second conductive members.

Another example of an alternative connector assembly has first conductive members that form a first row. Second conductive members include a first subset forming a second row and a second subset forming a third row, the second and third rows being parallel and offset with respect to one another. Individual ones of the first and second conductive members are arranged to be coupled at a first end to a corresponding contact. At least one of the first and second subsets may have a vertical displacement to form a common row of the second conductive members at a second end of the second conductive members. Individual ones of the first conductive members may be arranged to be coupled proximate a second end of the first conductive members to the second end of a corresponding one of the second conductive members.

As illustrated, the connector assembly 122 is coupled to the bottom side 120 of the chip package 102. As illustrated, the connector assembly 122 fits within a gap 126 between the chip package 102 and the circuit board 106. In various examples, the connector assembly 122 may fit within a gap 128 between the chip package and the socket 104. In general, the connector assembly 122 is configured to be positioned on the bottom side 120 of the chip package 102 and between the chip package 102 and any other structure, such as the circuit board 106 or socket 104, proximate the bottom side 120. As such, in the illustrated case, a thickness 130 of the connector assembly 122 may be not greater than the distance 132 of the gap 126. In the general case, the thickness 130 of the connector assembly 122 may be not greater than the distance between the bottom side 120 of the chip package 102 and the nearest proximate potential obstruction. In an example, the distance 132 of the gap 126 is approximately three (3) millimeters.

In various examples of connector assemblies that may be utilized for connecting on the bottom side 120 of the chip package 102, the connector assemblies may be vertical connectors, as with the connector assembly 122, or horizontal connectors. A connector assembly with vertical connectors may be coupled through the application of force in a direction generally orthogonal to a major plane of the bottom side 120 of the chip package 102. A connector assembly with a horizontal connector may be coupled through the application of force in a direction generally parallel with the major plane of the bottom side 120 of the chip package. In various examples, while the gaps 126, 128, as appropriate, may be approximately the same as the thickness 130 of the connector assembly 122 to allow for a readily removable connector assembly 122 with a horizontal connector, a vertical connector may require a larger gap 126, 128, as appropriate, to be readily removable.

Figure 2:
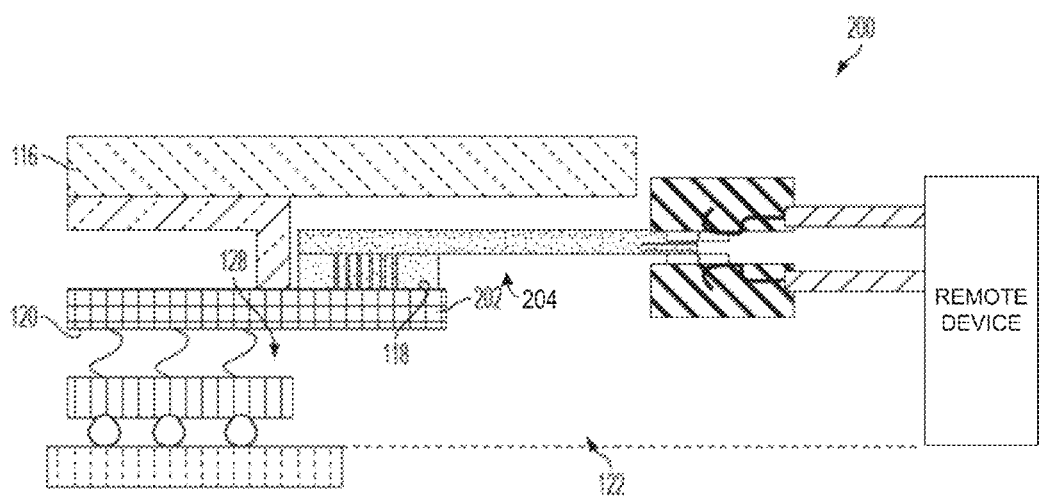
FIG. 2 is a side profile of a chip package assembly.

FIG. 2 is a side profile of a chip package assembly 200. The chip package assembly 202 as illustrated includes a chip package 202 with contacts on the top side 118 of the chip package 202 rather than the bottom side 120. Thus, the connector assembly 122 is configured to fit within the gap 204 between the top side 118 of the chip package 202 and the heat sink 116. Apart from the chip package 202 including the top side 118 contacts, the chip package assembly 200 may be otherwise the same as the chip package assembly 100 with the bottom side 120 contacts. Alternatively, the chip package assembly 200 with the top side 118 contacts may vary from the chip package assembly 100 in more significant ways.

Figure 3A:
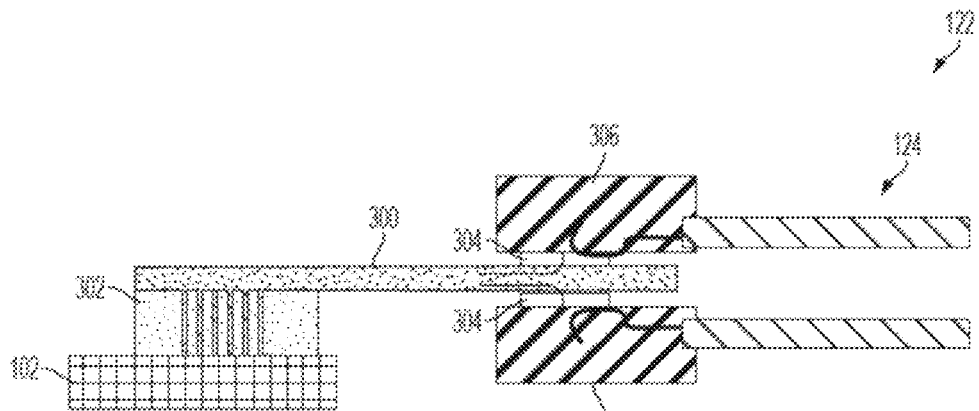
FIGS. 3A and 3B are examples of a connector assembly.
Figure 3B:
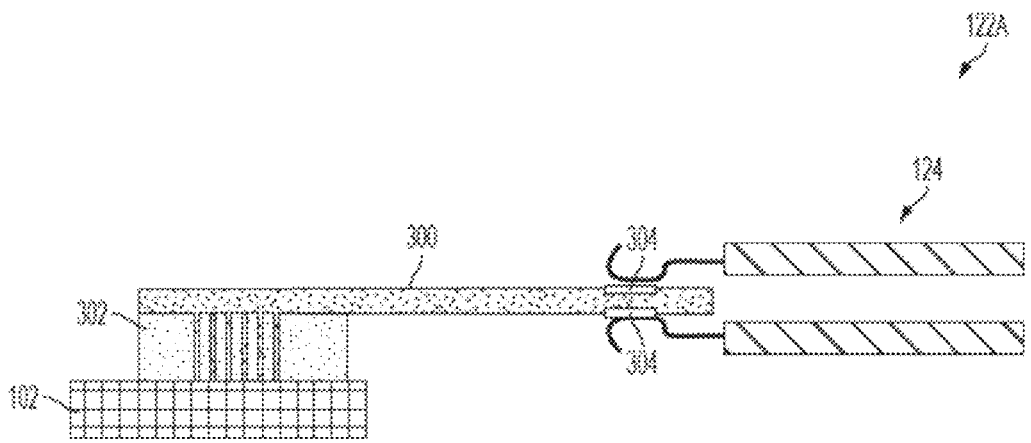

FIGS. 3A and 3B are two examples of the connector assembly 122. FIG. 3A is the connector assembly 122, while FIG. 3B is an alternative connector assembly 122A. Each connector assembly 122, 122A couples between the chip package 102 and the cable 124.

The connector assemblies 122, 122A include an interposer 300, such as a circuit board with traces included therein between contacts within the a connector pair 302 and contacts 304 for the cable 124. The connector assembly 122 includes two second connector pairs 306 for coupling the cable 124 to the connector assembly 122. The connector assembly 122A utilizes a direct attachment between the cable 124 and the contacts 304, such as by directly soldering the individual cable members to the individual contacts 304.

In various examples, the first connector pair 302 is configured to have relatively low resistance to insertion and removal of the connector pairs 302. In various examples, the connector pair 302 is a low insertion force (LIF) connector pair. Alternatively, the connector pair 302 includes mechanical engagement that may provide for relatively more resistance, such as with mechanical engagement members. In various examples, the second connector pairs 306 are single row connectors, such as a linear edge connector (LEC).

Figure 4:
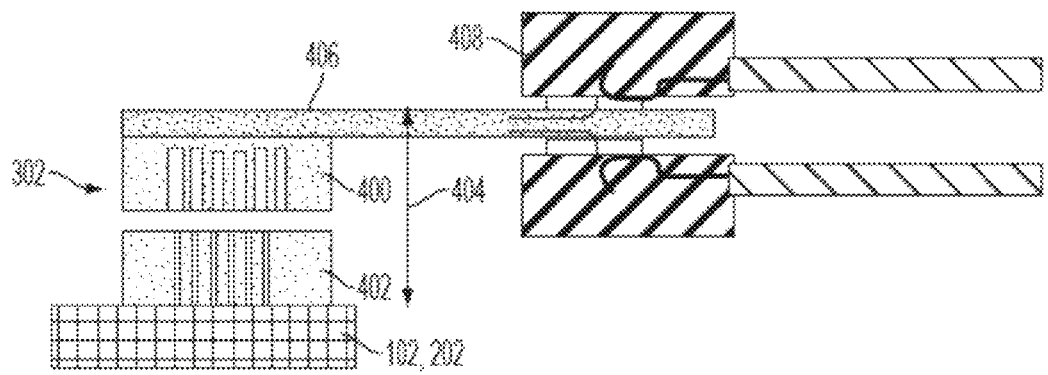
FIG. 4 is a side view of a connector assembly with a first connector pair mechanically and electrically disengaged.

FIG. 4 is a side view of the connector assembly with the first connector pair 302 mechanically and electrically disengaged. As illustrated, the first connector pair 302 includes a first connector 400 or "interposer connector" and a second connector 402 or a "package connector". As illustrated, the second connector 402 is a male connector that includes conductive members 404 that can electrically couple contacts on the chip package 102, 202 to contacts on the interposer 300. As illustrated, the first connector 400 is a female connector that may provide for mechanical engagement of the second connector 402 but that may not itself include conductive members. It is to be emphasized that, in various examples, the first connector 400 may include conductive members or may be a male connector while the second connector 402 may not include conductive members or may be a female connector.

In various examples, the second connector 402 is considered a component of the chip package 102, 202. Construction of the chip package 102, 202 may include incorporating the second connector 402. Alternatively, the second connector 402 may be considered a component of the connector assembly 122 and may be connected to the chip package 102, 202 upon pairing the connector assembly 122 to the chip package 102, 202 in operation.

With the first connector pair 302 decoupled, the connector assembly 122 has an disconnected connector assembly height 404 that may extend from the side 118 or 120 of the chip package 102, 202, as appropriate, to the side 406 of the interposer 300 or, in various examples, to the top 408 of the second connector pair 306. In such examples, the gaps 126, 128, 204 in which the connector assembly 122 is configured to be positioned may be greater than the disconnected connector assembly height 404 to permit the connector assembly 122 to be disconnected from the chip package 102, 202 by decoupling the first connector pair 302. Alternatively, if the gap 126, 128, 204 is less than the disconnected connected assembly height 404, the connector assembly 122 may not be disconnected unless the chip package 102, 202 were to be decoupled.

The disconnected connector assembly height 404 may be of consequence for vertical connector assemblies, such as the connector assembly 122 as illustrated. However, connector assemblies that incorporate horizontal connection may be disconnected and connected without the need to allow for increased height in the gaps 126, 128, 204.

Figure 5:
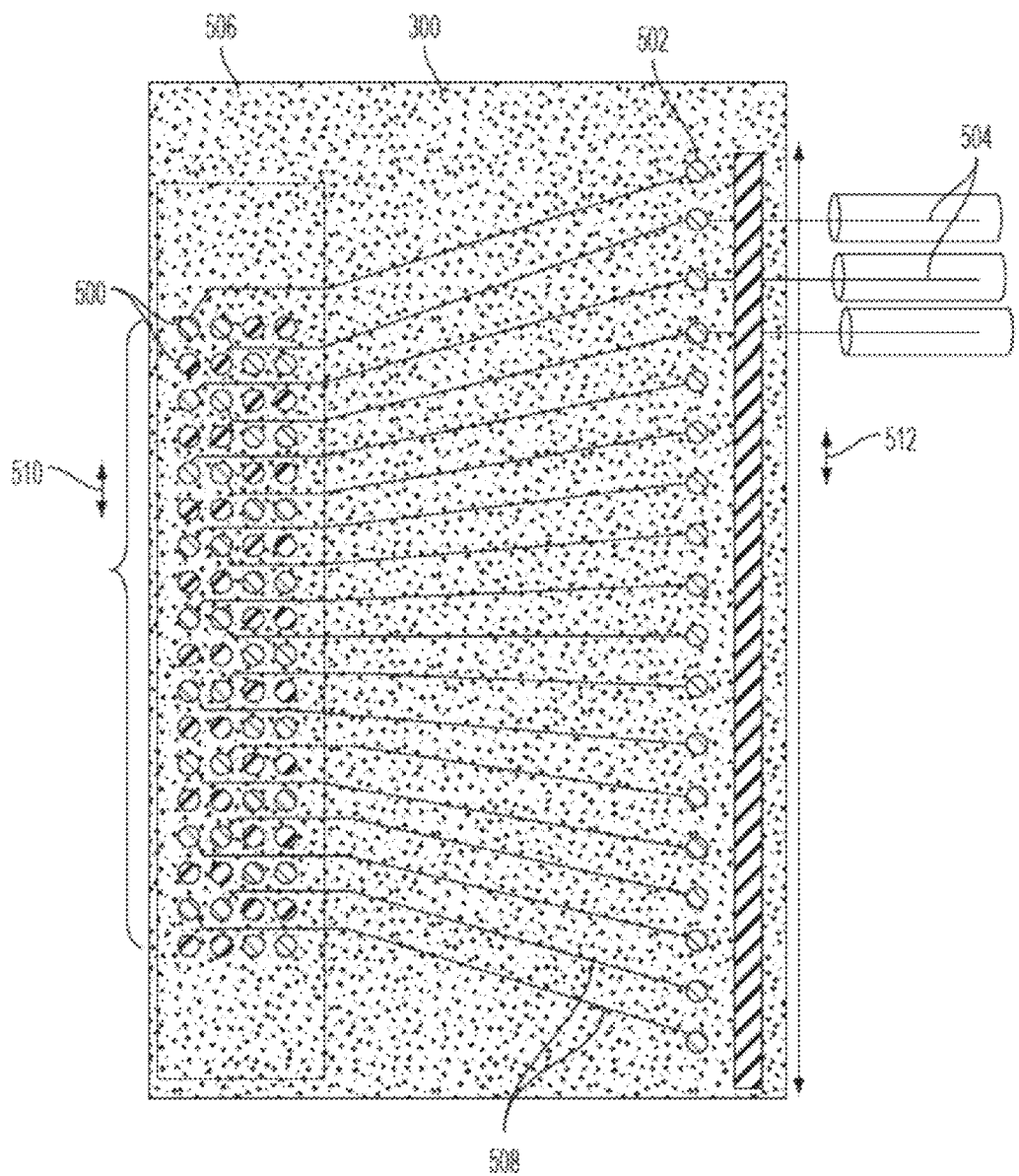
FIG. 5 is a top-view of an interposer.

FIG. 5 is a top-view of the interposer 300. The first plurality of interposer contacts 500 are configured to be mated with the first connector 400. The second plurality of interposer contacts 502 are configured to variably be mated to the second connector pair 306 or, as illustrated in FIG. 5, directly to the individual elements 504 of the cable 124. In various examples, the contacts 502 are the same as the cable contacts 304, or the cable contacts 304 may be components of the cable 124 that couple to the contacts 502.

The interposer 300 further includes an interposer circuit board 506 on which the contacts 500, 502 are positioned and variably through and on which conductive traces 508 connect individual ones of the contacts 500, 502. As noted above, the interposer circuit board 506 may be double sided, with the second plurality of interposer contacts 502 and the traces 508 positioned on either side of the interposer circuit board 506. In various examples, all of the first plurality of interposer contacts 500 are located on a single side of the interposer circuit board 506.

In various examples, a distance between adjacent contacts 500, 502 defines a pitch for the contacts 500, 502. In an example, the distance 510 between adjacent first contacts 500 is approximately 0.85 millimeters. In an example, the distance 510 between adjacent second contacts 502 is approximately 1.2 millimeters. Consequently, in the illustrated example, the first contacts 500 have a smaller pitch than the second contacts 502.

Figure 6A:
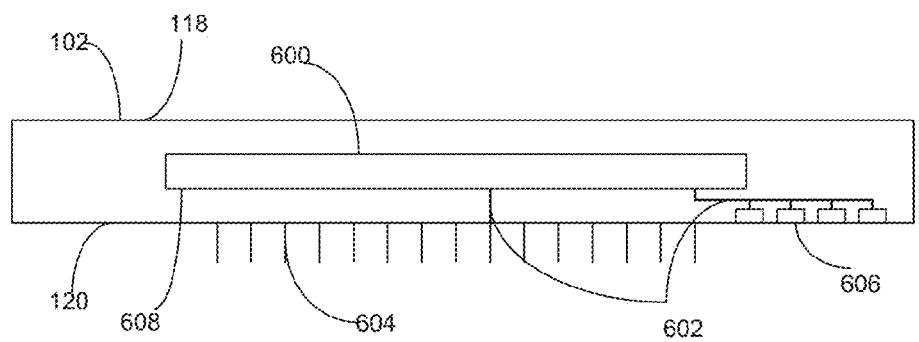
FIGS. 6A and 6B are simplified cut-away images of chip packages.
Figure 6B:
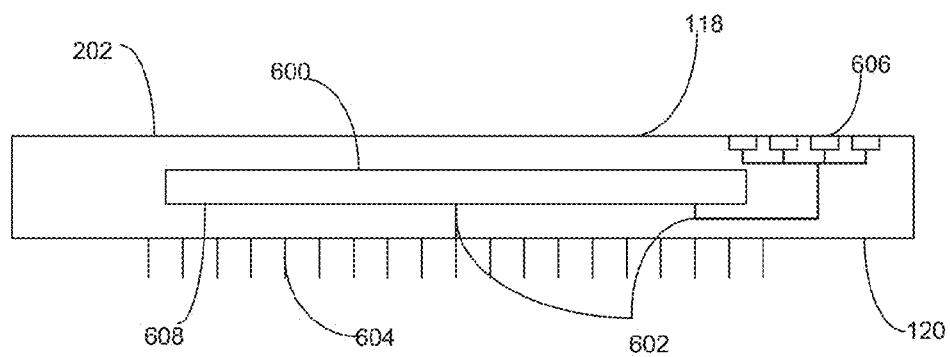

FIGS. 6A and 6B are simplified cut-away images of the chip packages 102, 202, respectively. Each chip package 102, 202 incorporates a die 600 and internal conductive lines 602, simplified for illustrative purposes. The conductive lines 602 electrically couple the die 600 to a first plurality of contacts 604, such as may be the socket contacts 108, and a second plurality of contacts 606, such as may couple to the package connector 402.

As illustrated, the chip package 102 is a bottom side chip package, as both the first and second plurality of contacts 604, 606 are on the same side, i.e., the bottom side 120. Relatedly, the chip package 202 is a top side chip package in that the second plurality of contacts 606 are located on the top side 118, i.e., opposite the side 120 of the first plurality of contacts 604. While the conductive lines 602 are illustrated as emerging from a single side 608 of the die 600, and the die 600 is illustrated as being centrally located within the chip packages 102, 202, is to be understood that the illustration of the chip packages 102, 202 is abstract and that the layout of the actual componentry of the chip packages 102, 202 may vary from the illustrated examples.

Figure 7:
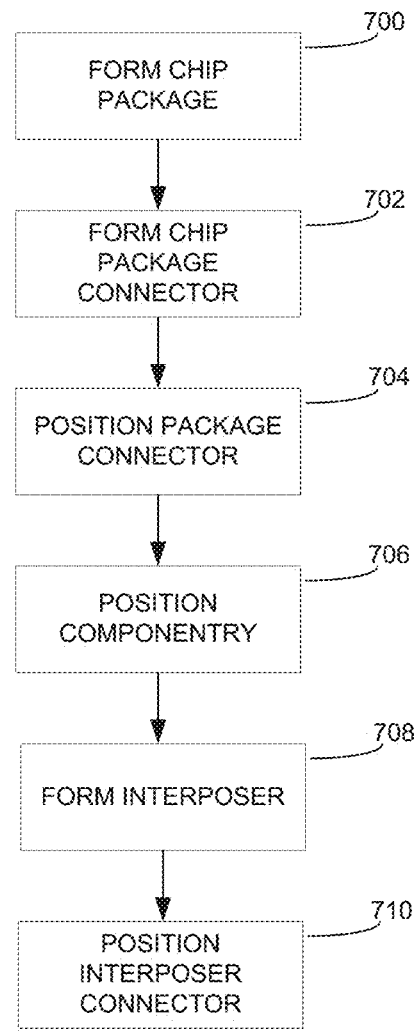
FIG. 7 is a flowchart for making a package.

FIG. 7 is a flowchart for making a chip package assembly and connector assembly and components thereof. The flowchart or portions of the flowchart may be applied to the creation of a variety of chip packages, connectors, and connector assemblies in addition to the chip package assemblies 100, 200 and the connector assembly 122. Additionally, the chip package assemblies 100, 200 and the connector assembly 122 and components thereof may alternatively be made according to any of a variety of suitable methods.

At 700, a chip package is formed having a first side and a second side opposite the first side, the chip package include a plurality of electrical contacts positioned with respect to the first side. In an example, the chip package includes a plurality of circuit board contacts on the first side.

At 702, a package connector is formed.

At 704, the package connector is positioned with respect to the first side.

At 706, componentry is positioned forming a gap between the componentry and the first side, the package connector being positioned, at least in part, within the gap. In an example, the componentry is at least one of a socket arranged to seat the chip package and electrically couple to the contacts and a circuit board. In an example, the componentry comprises both the socket and the circuit board, wherein the socket is electrically and mechanically coupled to the circuit board. In an example, the gap is between the first side of the chip package and the circuit board.

In an example, the second side includes a plurality of circuit board contacts, and wherein the componentry is heat management componentry. In an example, the heat management componentry comprises at least one of a heat spreader and a heat sink. In an example, the heat management componentry comprises both the heat spread and the heat sink and wherein the gap is between the first side of the chip package and the heat sink.

At 708, an interposer is formed or built including a first plurality of interposer contacts, a second plurality of interposer contacts, and a plurality of traces, each of the traces electrically coupling one of the first plurality of interposer contacts to one of the second plurality of interposer contacts. In an example, the first plurality of interposer contacts have a first pitch and the second plurality of interposer contacts have a second pitch greater than the first pitch.

In an example, the interposer comprises a circuit board, wherein the first and second plurality of interposer contacts are positioned on the circuit board and the traces are at least one of embedded in the circuit board and positioned on the circuit board. In an example, the circuit board has a first side and a second side opposite the first side, wherein all of the first plurality of interposer contacts are located on the first side, wherein a first subset of the second plurality of interposer contacts are positioned on the first side, and wherein a second subset of the second plurality of interposer contacts are positioned on the second side. In an example, the first plurality of interposer contacts form a plurality of rows on the first side and wherein the second plurality of interposer contacts form only one row on each of the first side and the second side.

In an example, the first plurality of interposer contacts are proximate a first end of the interposer and wherein the second plurality of interposer contacts are proximate a second end of the interposer opposite the first end. In an example, the second plurality of interposer contacts are arranged to be coupled to individual members of a cable. In an example, the second connector includes conductive members arranged to be electrically coupled to contacts on a chip package, and wherein the first and second plurality of interposer contacts and the traces are configured to electrically couple the contacts to the individual members of the cable.

At 710, an interposer connector is positioned with respect to the interposer. The interposer connector is arranged to be electrically and mechanically coupled to a package connector.

Figure 8:
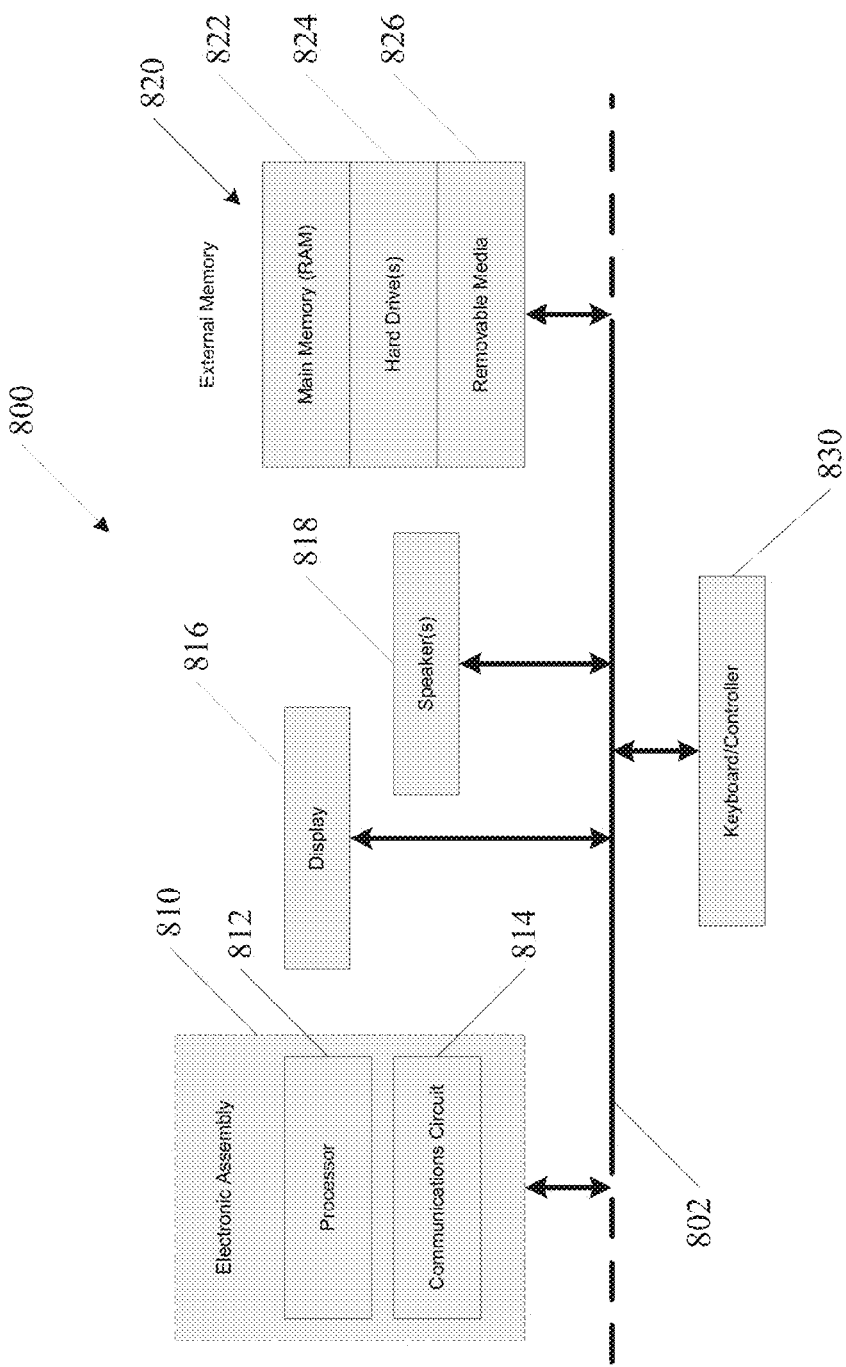
FIG. 8 is a block diagram of an electronic device incorporating at least one package.

An example of an electronic device using semiconductor chips and elongated structures as described in the present disclosure is included to show an example of a higher level device application for the present invention. FIG. 8 is a block diagram of an electronic device 800 incorporating at least one package, such as a package 100, 200 or other package described in examples herein. The electronic device 800 is merely one example of an electronic system in which embodiments of the present invention can be used. Examples of electronic devices 800 include, but are not limited to personal computers, tablet computers, mobile telephones, personal data assistants, MP3 or other digital music players, etc. In this example, the electronic device 800 comprises a data processing system that includes a system bus 802 to couple the various components of the system. The system bus 802 provides communications links among the various components of the electronic device 800 and can be implemented as a single bus, as a combination of busses, or in any other suitable manner.

An electronic assembly 810 is coupled to the system bus 802. The electronic assembly 810 can include any circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 810 are a custom circuit, an application-specific integrated circuit (ASIC), or the like, such as, for example, one or more circuits (such as a communications circuit 814) for use in wireless devices like mobile telephones, pagers, personal data assistants, portable computers, two-way radios, and similar electronic systems. The IC can perform any other type of function.

The electronic device 800 can also include an external memory 820, which in turn can include one or more memory elements suitable to the particular application, such as a main memory 822 in the form of random access memory (RAM), one or more hard drives 824, and/or one or more drives that handle removable media 826 such as compact disks (CD), digital video disk (DVD), and the like.

The electronic device 800 can also include a display device 816, one or more speakers 818, and a keyboard and/or controller 830, which can include a mouse, trackball, touch screen, voice-recognition device, or any other device that permits a system user to input information into and receive information from the electronic device 800.

Additional Examples

Example 1 may include subject matter (such as an apparatus, a method, a means for performing acts) that can include a chip package assembly arranged to be electrically coupled to a circuit board including a plurality of circuit board contacts. The chip package assembly may comprise a chip package including a first side and a second side, the second side including a first plurality of contacts arranged to be electrically coupled to the plurality of circuit board contacts and a second plurality of contacts arranged to be electrically coupled to a remote device via a connector assembly.

In Example 2, the chip package assembly of Example 1 can optionally further include a chip package connector, the chip package connector comprising a plurality of conductive members electrically coupled to the second plurality of contacts and the remote device.

In Example 3, the chip package assembly of any one or more of Examples 1 and 2 can optionally further include that the connector assembly further comprises an interposer, including a first plurality of interposer contacts, a second plurality of interposer contacts, and a plurality of traces, each of the traces electrically coupling one of the first plurality of interposer contacts to one of the second plurality of interposer contacts. The connector assembly further comprises an interposer connector positioned with respect to the interposer and arranged to mechanically engage with the chip package connector. The first plurality of interposer contacts and the second plurality of contacts of the chip package have a first pitch and the second plurality of interposer contacts have a second pitch greater than the first pitch.

In Example 4, the chip package assembly of any one or more of Examples 1-3 can optionally further include that the connector assembly is coupled to the remote device via a conductive cable.

In Example 5, the chip package assembly of any one or more of Examples 1-4 can optionally further include that the first plurality of contacts are arranged to be electrically and mechanically coupled to at least one of a circuit board and a socket, the circuit board including the circuit board contacts and the socket being arranged to mechanically seat the chip package.

In Example 6, the chip package assembly of any one or more of Examples 1-5 can optionally further include that the chip package is seated in the socket and the socket provides electrical coupling between the first plurality of contacts and the circuit board contacts.

In Example 7, the chip package assembly of any one or more of Examples 1-6 can optionally further include that the chip package is electrically and mechanically coupled to the circuit board via solder balls between the first plurality of contacts and the circuit board contacts.

Example 8 may include subject matter (such as an apparatus, a method, a means for performing acts) that can include a connector assembly, comprising an interposer, including a first plurality of interposer contacts, a second plurality of interposer contacts, and a plurality of traces, each of the traces electrically coupling one of the first plurality of interposer contacts to one of the second plurality of interposer contacts. The connector assembly optionally further comprises a first connector positioned with respect to the interposer. The first plurality of interposer contacts have a first pitch and the second plurality of interposer contacts have a second pitch greater than the first pitch. The first connector is arranged to be electrically and mechanically coupled to a second connector.

In Example 9, the connector assembly of Example 8 can optionally further include that the interposer comprises a circuit board, wherein the first and second plurality of interposer contacts are positioned on the circuit board and the traces are at least one of embedded in the circuit board and positioned on the circuit board.

In Example 10, the connector assembly of any one or more of Examples 8 and 9 can optionally further include that the circuit board has a first side and a second side opposite the first side, wherein all of the first plurality of interposer contacts are located on the first side, wherein a first subset of the second plurality of interposer contacts are positioned on the first side, and wherein a second subset of the second plurality of interposer contacts are positioned on the second side.

In Example 11, the connector assembly of any one or more of Examples 8-10 can optionally further include that the first plurality of interposer contacts form a plurality of rows on the first side and wherein the second plurality of interposer contacts form only one row on each of the first side and the second side.

In Example 12, the connector assembly of any one or more of Examples 8-11 can optionally further include that the first plurality of interposer contacts are proximate a first end of the interposer and wherein the second plurality of interposer contacts are proximate a second end of the interposer opposite the first end.

In Example 13, the connector assembly of any one or more of Examples 8-12 can optionally further include that the second plurality of interposer contacts are arranged to be coupled to individual members of a cable.

In Example 14, the connector assembly of any one or more of Examples 8-13 can optionally further include that the second connector includes conductive members arranged to be electrically coupled to contacts on a chip package, and wherein the first and second plurality of interposer contacts and the traces are arranged to electrically couple the contacts to the individual members of the cable.

Example 15 may include subject matter (such as an apparatus, a method, a means for performing acts) that can include an assembly, comprising a chip package assembly comprising a chip package having a first side and a second side opposite the first side, the chip package include a plurality of electrical contacts positioned with respect to the first side, a package connector positioned with respect to the first side, and componentry forming a gap between the componentry and the first side, the package connector being positioned, at least in part, within the gap. The assembly optionally further includes a connector assembly, comprising an interposer, including a first plurality of interposer contacts, a second plurality of interposer contacts, and a plurality of traces, each of the traces electrically coupling one of the first plurality of interposer contacts to one of the second plurality of interposer contacts. The connector assembly optionally further includes a plurality of traces, each of the traces electrically coupling one of the first plurality of interposer contacts to one of the second plurality of interposer contacts. The first plurality of interposer contacts have a first pitch and the second plurality of interposer contacts have a second pitch greater than the first pitch. The interposer connector is arranged to be electrically and mechanically coupled to the package connector at least partially within the gap.

In Example 16, the assembly of Example 15 can optionally further include that the chip package includes a plurality of circuit board contacts on the first side, and wherein the componentry is at least one of: a socket arranged to seat the chip package and electrically couple to the contacts; and a circuit board.\

In Example 17, the assembly of any one or more of Examples 15 and 16 can optionally further include that the componentry comprises both the socket and the circuit board, wherein the socket is electrically and mechanically coupled to the circuit board.

In Example 18, the assembly of any one or more of Examples 15-17 can optionally further include that the gap is between the first side of the chip package and the circuit board.

In Example 19, the assembly of any one or more of Examples 15-18 can optionally further include that the second side includes a plurality of circuit board contacts, and wherein the componentry is heat management componentry.

In Example 20, the assembly of any one or more of Examples 15-19 can optionally further include that the heat management componentry comprises at least one of a heat spreader and a heat sink.

In Example 21, the assembly of any one or more of Examples 15-20 can optionally further include that the heat management componentry comprises both the heat spread and the heat sink and wherein the gap is between the first side of the chip package and the heat sink.

Example 22 may include subject matter (such as an apparatus, a method, a means for performing acts) that can include a method of making a chip package assembly arranged to be electrically coupled to a circuit board including a plurality of circuit board contacts. The chip package assembly may be made by forming a chip package including a first side and a second side, the second side including a first plurality of contacts arranged to be electrically coupled to the plurality of circuit board contacts and a second plurality of contacts arranged to be electrically coupled to a remote device via a connector assembly.

In Example 23, the method of Example 22 can optionally further include forming a chip package connector, the chip package connector comprising a plurality of conductive members electrically coupled to the second plurality of contacts and the remote device.

In Example 24, the method of any one or more of Examples 22 and 23 can optionally further include building an interposer, including a first plurality of interposer contacts, a second plurality of interposer contacts, and a plurality of traces, each of the traces electrically coupling one of the first plurality of interposer contacts to one of the second plurality of interposer contacts. The method further comprises positioning a connector with respect to the interposer and arranged to mechanically engage with the chip package connector. The first plurality of interposer contacts and the second plurality of contacts of the chip package have a first pitch and the second plurality of interposer contacts have a second pitch greater than the first pitch.

In Example 25, the method of any one or more of Examples 22-24 can optionally further include coupling the connector assembly to the remote device via a conductive cable.

In Example 26, the method of any one or more of Examples 22-25 can optionally further include that the first plurality of contacts are arranged to be electrically and mechanically coupled to at least one of a circuit board and a socket, the circuit board including the circuit board contacts and the socket being arranged to mechanically seat the chip package.

In Example 27, the method of any one or more of Examples 22-26 can optionally further include seating the chip package in the socket and the socket provides electrical coupling between the first plurality of contacts and the circuit board contacts.

In Example 28, the method of any one or more of Examples 22-27 can optionally further include coupling, electrically and mechanically, the chip package to the circuit board via solder balls between the first plurality of contacts and the circuit board contacts.

Example 29 may include subject matter (such as an apparatus, a method, a means for performing acts) that can include a method of making connector assembly, comprising building an interposer, including a first plurality of interposer contacts, a second plurality of interposer contacts, and a plurality of traces, each of the traces electrically coupling one of the first plurality of interposer contacts to one of the second plurality of interposer contacts. The method optionally further comprises positioning a first connector with respect to the interposer. The first plurality of interposer contacts have a first pitch and the second plurality of interposer contacts have a second pitch greater than the first pitch. The first connector is arranged to be electrically and mechanically coupled to a second connector.

In Example 30, the method of Example 29 can optionally further include that the interposer comprises a circuit board, further comprising positioning the first and second plurality of interposer contacts on the circuit board and the traces are at least one of embedded in the circuit board and positioned on the circuit board.

In Example 31, the method of any one or more of Examples 29 and 30 can optionally further include that the circuit board has a first side and a second side opposite the first side, wherein all of the first plurality of interposer contacts are located on the first side, further comprising positioning a first subset of the second plurality of interposer contacts on the first side, and wherein a second subset of the second plurality of interposer contacts are positioned on the second side.

In Example 32, the method of any one or more of Examples 29-31 can optionally further include that the first plurality of interposer contacts form a plurality of rows on the first side and wherein the second plurality of interposer contacts form only one row on each of the first side and the second side.

In Example 33, the method of any one or more of Examples 29-32 can optionally further include that the first plurality of interposer contacts are proximate a first end of the interposer and wherein the second plurality of interposer contacts are proximate a second end of the interposer opposite the first end.

In Example 34, the method of any one or more of Examples 29-33 can optionally further include that the second plurality of interposer contacts are arranged to be coupled to individual members of a cable.

In Example 35, the method of any one or more of Examples 29-34 can optionally further include that the second connector includes conductive members arranged to be electrically coupled to contacts on a chip package, and wherein the first and second plurality of interposer contacts and the traces are arranged to electrically couple the contacts to the individual members of the cable.

Example 36 may include subject matter (such as an apparatus, a method, a means for performing acts) that can include a method for making an assembly, comprising forming a chip package assembly comprising a chip package having a first side and a second side opposite the first side, the chip package include a plurality of electrical contacts positioned with respect to the first side, a package connector positioned with respect to the first side, and componentry forming a gap between the componentry and the first side, the package connector being positioned, at least in part, within the gap. The method further includes building a connector assembly, comprising an interposer, including a first plurality of interposer contacts, a second plurality of interposer contacts, and a plurality of traces, each of the traces electrically coupling one of the first plurality of interposer contacts to one of the second plurality of interposer contacts. The connector assembly optionally further includes a plurality of traces, each of the traces electrically coupling one of the first plurality of interposer contacts to one of the second plurality of interposer contacts. The first plurality of interposer contacts have a first pitch and the second plurality of interposer contacts have a second pitch greater than the first pitch. The interposer connector is arranged to be electrically and mechanically coupled to the package connector at least partially within the gap.

In Example 37, the method of Example 36 can optionally further include that the chip package includes a plurality of circuit board contacts on the first side, and wherein the componentry is at least one of: a socket arranged to seat the chip package and electrically couple to the contacts; and a circuit board.

In Example 38, the method of any one or more of Examples 36 and 37 can optionally further include that the componentry comprises both the socket and the circuit board, wherein the socket is electrically and mechanically coupled to the circuit board.

In Example 39, the method of any one or more of Examples 36-38 can optionally further include that the gap is between the first side of the chip package and the circuit board.

In Example 40, the method of any one or more of Examples 36-39 can optionally further include that the second side includes a plurality of circuit board contacts, and wherein the componentry is heat management componentry.

In Example 41, the method of any one or more of Examples 36-40 can optionally further include that the heat management componentry comprises at least one of a heat spreader and a heat sink.

In Example 42, the method of any one or more of Examples 36-41 can optionally further include that the heat management componentry comprises both the heat spread and the heat sink and wherein the gap is between the first side of the chip package and the heat sink.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A chip package assembly arranged to be electrically coupled to a circuit board including a plurality of circuit board contacts, comprising:
    a chip package including a first side and a second side, the second side including:
        a first plurality of contacts arranged to be electrically coupled to the plurality of circuit board contacts; and
        a second plurality of contacts arranged to be electrically coupled to a remote device via a connector assembly; and
    a chip package connector comprising a plurality of conductive members electrically coupled to the second plurality of contacts and the remote device; wherein the first plurality of contacts are arranged to be electrically and mechanically coupled to at least one of a circuit board and a socket, the circuit board including the circuit board contacts and the socket being arranged to mechanically seat the chip package.

2. The chip package assembly of claim 1, wherein the connector assembly further comprises:
    an interposer, including:
        a first plurality of interposer contacts;
        a second plurality of interposer contacts; and
        a plurality of traces, each of the traces electrically coupling one of the first plurality of interposer contacts to one of the second plurality of interposer contacts; and
    an interposer connector positioned with respect to the interposer and arranged to mechanically engage with the chip package connector; wherein the first plurality of contacts and the second plurality of contacts of the chip package have a first distance between adjacent contacts and the second plurality of interposer contacts have a second distance between adjacent contacts greater than the first distance between adjacent contacts.

3. The chip package assembly of claim 1, wherein the chip package is seated in the socket and the socket provides electrical coupling between the first plurality of contacts and the circuit board contacts.

4. The chip package assembly of claim 1, wherein the chip package is electrically and mechanically coupled to the circuit board via solder balls between the first plurality of contacts and the circuit board contacts.

5. The chip package assembly of claim 2, wherein the connector assembly is coupled to the remote device via a conductive cable.

6. A connector assembly comprising:
    an interposer, including:
        a first plurality of interposer contacts;
        a second plurality of interposer contacts; and
        a plurality of traces, each of the traces electrically coupling one of the first plurality of interposer contacts to one of the second plurality of interposer contacts; and
    a first connector positioned with respect to the interposer;
    wherein the first plurality of interposer contacts have a first distance between adjacent contacts and the second plurality of interposer contacts have a second distance between adjacent contacts greater than the first distance between adjacent contacts;
    wherein the first connector is arranged to be electrically and mechanically coupled to a second connector;
    wherein the interposer comprises a circuit board, wherein the first and second plurality of interposer contacts are positioned on the circuit board and the traces are at least one of embedded in the circuit board and positioned on the circuit board; and
    wherein the circuit board has a first side and a second side opposite the first side, wherein all of the first plurality of interposer contacts are located on the first side, wherein a first subset of the second plurality of interposer contacts are positioned on the first side, and wherein a second subset of the second plurality of interposer contacts are positioned on the second side.

7. The connector assembly of claim 6, wherein the first plurality of interposer contacts form a plurality of rows on the first side and wherein the second plurality of interposer contacts form only one row on each of the first side and the second side.

8. The connector assembly of claim 6, wherein the first plurality of interposer contacts are proximate a first end of the interposer and wherein the second plurality of interposer contacts are proximate a second end of the interposer opposite the first end.

9. The connector assembly of claim 6, wherein the second plurality of interposer contacts are arranged to be coupled to individual members of a cable.

10. The connector assembly of claim 9, wherein the second connector includes conductive members arranged to be electrically coupled to contacts on a chip package, and wherein the first and second plurality of interposer contacts and the traces are arranged to electrically couple the contacts to the individual members of the cable.

11. An assembly, comprising:
    a chip package assembly, comprising:
        a chip package having a first side and a second side opposite the first side, the chip package include a plurality of electrical contacts positioned with respect to the first side;

a package connector positioned with respect to the first side; and componentry positioned to form a gap between the componentry and the first side, the package connector being positioned, at least in part, within the gap; and a connector assembly, comprising:
  an interposer, including:
    a first plurality of interposer contacts;
    a second plurality of interposer contacts; and
    a plurality of traces, each of the traces electrically coupling one of the first plurality of interposer contacts to one of the second plurality of interposer contacts; and
  an interposer connector positioned with respect to the interposer;
  wherein the first plurality of interposer contacts have a first distance between adjacent contacts and the second plurality of interposer contacts have a second distance between adjacent contacts greater than the first distance between adjacent contacts;
  wherein the interposer connector is arranged to be electrically and mechanically coupled to the package connector at least partially within the gap.

12. The assembly of claim 11, wherein the plurality of electrical contacts include a plurality of circuit board contacts on the first side, and wherein the componentry is at least one of:
  a socket arranged to seat the chip package and electrically couple to the contacts; and
  a circuit board.

13. The assembly of claim 11, wherein the second side includes a plurality of circuit board contacts, and wherein the componentry is heat management componentry.

14. The assembly of claim 12, wherein the componentry comprises both the socket and the circuit board, wherein the socket is electrically and mechanically coupled to the circuit board.

15. The assembly of claim 13, wherein the heat management componentry comprises at least one of a heat spreader and a heat sink.

16. The assembly of claim 14, wherein the gap is between the first side of the chip package and the circuit board.

17. The assembly of claim 15, wherein the heat management componentry comprises both the heat spread and the heat sink and wherein the gap is between the first side of the chip package and the heat sink.

* * * * *

UNITED STATES PATENT AND TRADEMARK OFFICE
CERTIFICATE OF CORRECTION

PATENT NO. : 9,674,954 B2
APPLICATION NO. : 13/826614
DATED : June 6, 2017
INVENTOR(S) : Swaminathan et al.

Page 1 of 1

It is certified that error appears in the above-identified patent and that said Letters Patent is hereby corrected as shown below:

In the Claims

In Column 14, Line 16, in Claim 6, delete "assembly" and insert --assembly,-- therefor Signed and Sealed this
Twenty-eighth Day of May, 2019

Andrei Iancu
*Director of the United States Patent and Trademark Office*